United States Patent [19]

Stanford, Jr. et al.

[11] Patent Number: 5,456,759
[45] Date of Patent: * Oct. 10, 1995

[54] METHOD USING MEGASONIC ENERGY IN LIQUEFIED GASES

[75] Inventors: Thomas B. Stanford, Jr., San Pedro; Sidney C. Chao, Manhattan Beach, both of Calif.

[73] Assignee: Hughes Aircraft Company, Los Angeles, Calif.

[*] Notice: The portion of the term of this patent subsequent to May 31, 2011 has been disclaimed.

[21] Appl. No.: 283,927

[22] Filed: Aug. 1, 1994

Related U.S. Application Data

[63] Continuation of Ser. No. 44,684, Apr. 12, 1993, abandoned, which is a continuation-in-part of Ser. No. 927,443, Aug. 10, 1992, Pat. No. 5,316,591.

[51] Int. Cl.$^6$ .............................. B08B 3/08; B08B 3/12
[52] U.S. Cl. ................................... 134/1; 134/10
[58] Field of Search ................... 134/1, 10, 11, 134/12, 30, 31

[56] References Cited

U.S. PATENT DOCUMENTS

| | | | |
|---|---|---|---|
| 3,529,998 | 9/1970 | Singer | 134/1 |
| 3,893,869 | 7/1975 | Mayer et al. | 134/86 |
| 3,901,726 | 8/1975 | Snearly | 134/1 |
| 4,618,263 | 10/1986 | McCord | 366/127 |
| 4,854,337 | 8/1989 | Bunkenburg et al. | 134/1 X |
| 4,906,387 | 3/1990 | Pisani | 210/748 |
| 4,979,994 | 12/1990 | Dussault et al. | 134/1 |
| 4,990,260 | 2/1991 | Pisani | 210/664 |
| 5,013,366 | 5/1991 | Jackson et al. | 134/1 |
| 5,062,898 | 11/1991 | McDermott et al. | 134/7 |
| 5,068,040 | 11/1991 | Jackson | 210/748 |
| 5,071,776 | 12/1991 | Matsushita et al. | 139/1 X |
| 5,143,103 | 9/1992 | Basso et al. | 134/1 X |
| 5,213,619 | 5/1993 | Jackson et al. | 134/1 |
| 5,316,591 | 5/1994 | Chao et al. | 134/34 |

FOREIGN PATENT DOCUMENTS 0583653 2/1994 European Pat. Off. .

OTHER PUBLICATIONS

Patent Abstracts of Japan, vol. 15, No. 448 (E-1133) 14 Nov. 1991 (Abstract only).
Database WPI, Section EI, Week 9404,Derwent, Class U, p. 11, AN 94-034039 C04 (Abstract only).
Database WPI, Awxtion Ch, Week 9334, Derwent, ClassL, p. 103, An 93-267829 C34 (Abstract only).
Patent Application No. 07/927,443, Chao et al., filed Aug. 10, 1992.

*Primary Examiner*—Jan H. Silbaugh
*Assistant Examiner*—Saeed T. Chaudhry
*Attorney, Agent, or Firm*—Mary E. Lachman; Michael W. Sales; Wanda K. Denson-Low

[57] ABSTRACT

A process for removing undesired sub-micrometer particulates from a chosen substrate (16) comprising the steps of: (a) placing the substrate containing the undesired particulates in a cleaning chamber (12) provided with megasonic energy-producing means (20); (b) introducing a liquefied gas (22), such as liquid carbon dioxide, into the cleaning chamber and contacting the substrate containing the undesired particulates with the liquid carbon dioxide at a temperature below its critical temperature; and (c) exposing the liquid carbon dioxide to the megasonic energy-producing means for a period of time sufficient to remove the undesired particulates from the substrate. The substrate containing the undesired particulates may optionally be contacted with carbon dioxide in the dense phase prior to and/or after the treatment with megasonic energy to aid in removal of the undesired particulates. Further, spent liquid carbon dioxide may be treated to regenerate fresh liquid carbon dioxide which is recycled to the cleaning chamber. Other gases besides carbon dioxide which may be used include nitrous oxide, sulfur hexafluoride, and xenon. Further, gas mixtures and gas mixtures with suitable modifiers may be employed.

14 Claims, 1 Drawing Sheet

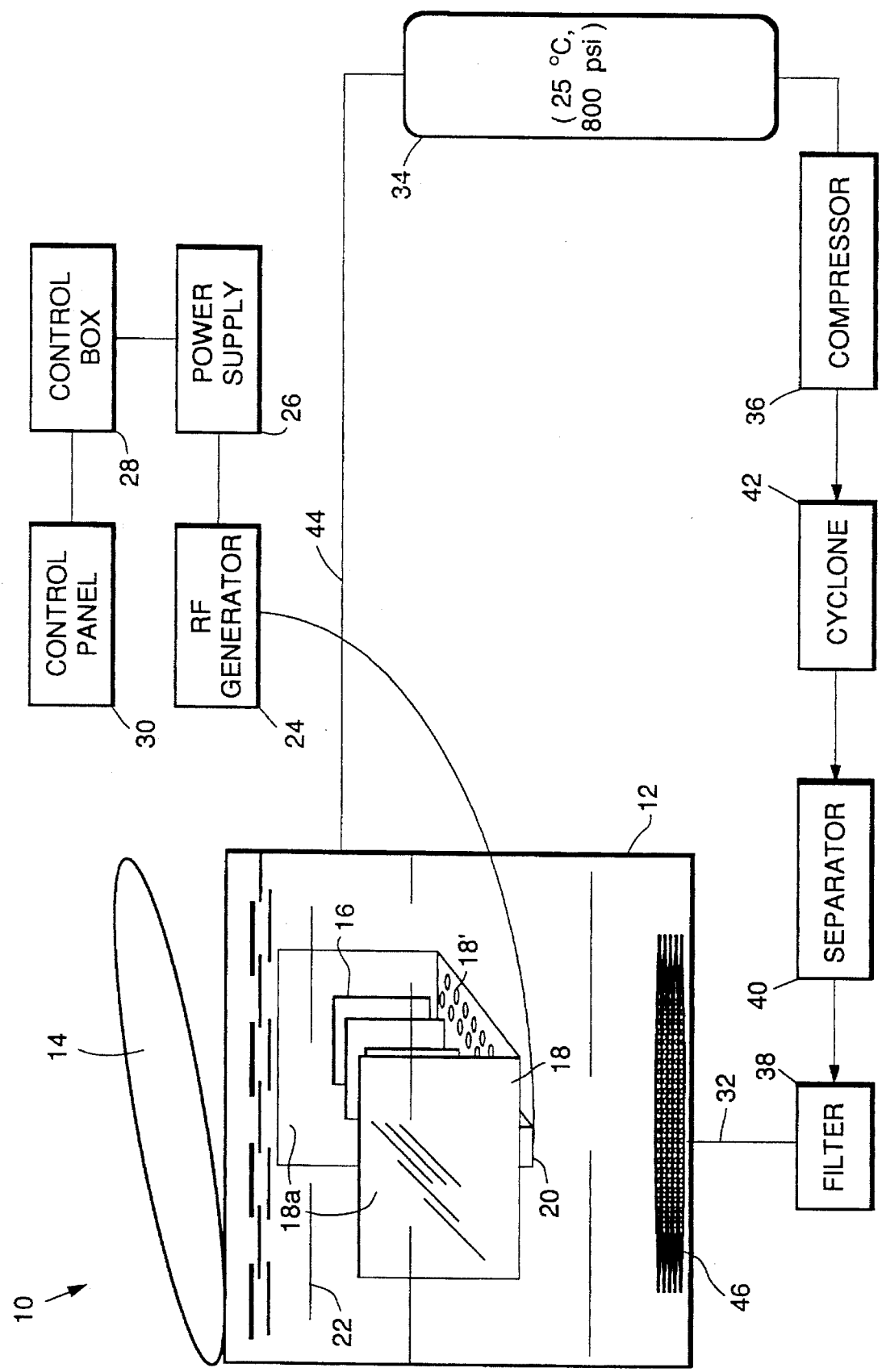

5,456,759

METHOD USING MEGASONIC ENERGY IN LIQUEFIED GASES

CROSS-REFERENCE TO RELATED APPLICATION

This is a continuation of application Ser. No. 08/044,684 filed Apr. 12, 1993, now abandoned, which is a continuation-in-part application of Ser. No. 07/927,443, filed Aug. 10, 1992 now U.S. Pat. No. 5,316,591.

BACKGROUND OF THE INVENTION

1. Field of the Invention

The present invention relates to the use of megasonic energy (>110 to 2,000 Kilohertz) to clean substrates, and, more particularly, to a process employing liquefied gas, such as liquid carbon dioxide, in combination with megasonic energy to enhance the cleaning of a wide variety of substrates, including complex materials and hardware.

2. Description of Related Art

Ultrasonic cleaning has been utilized by industry for a number of years. In the conventional processes, the sonicating media are either organic solvents, or water and aqueous solutions, and ultrasonic energy (about 20 to 100 Kilohertz) is applied to the media to promote cavitation, i.e., the formation of bubbles and their subsequent collapse. Although adequate for the sonication cleaning, both types of solvents have disadvantages. Many substrates require a rigorous drying process following exposure to an aqueous medium, and this is often a time-consuming thermal excursion. The use of organic solvents as sonicating media presents the problem of chemical disposal and is subject to strict regulatory controls. An additional disadvantage relates to handling of the removed contaminant(s), whether organic or particulate. When the contaminant is a hazardous material, such as a radioactive particle, once in solution or suspension, the volume of the hazardous waste is substantially increased, and this presents an additional pretreatment/disposal problem.

In these conventional ultrasonic cleaning processes, sonic horns are often used to produce the sonic energy. In other processes, a cavitation nozzle may be used.

Liquid carbon dioxide ($CO_2$) is an inexpensive, nontoxic substance. The cleaning process utilizing liquid $CO_2$ is relatively simple, and contaminants taken up in liquid $CO_2$ are easily removed therefrom, such as by decompression of the liquid or by filtration or by a combination of the two. Other suitable liquefiable gases may be used.

Another type of cleaning process, utilizing phase shifting of dense phase gases, has been disclosed and claimed in U.S. Pat. No. 5,013,366, issued to D. P. Jackson et al and assigned to the same assignee as the present application. The latter process employs a dense phase gas at or above the critical pressure. The phase of the dense phase gas is then shifted between the liquid state and the supercritical state by varying the temperature of the dense fluid in a series of steps between temperatures above and below the critical temperature of the dense fluid, while maintaining the pressure above the critical value. Examples of fluids include (1) hydrocarbons, such as methane, ethane, propane, butane, pentane, hexane, ethylene, and propylene; (2) halogenated hydrocarbons, such as tetrafluoromethane, chlorodifluoromethane, and perfluoropropane; (3) inorganics, such as carbon dioxide, ammonia, helium, krypton, argon, sulfur hexafluoride, and nitrous oxide; and (4) mixtures thereof. In alternative embodiments, the dense phase gas may be exposed to ultraviolet (UV) radiation during the cleaning process or ultrasonic energy may be applied during the cleaning process to agitate the dense phase gas and the substrate surface.

Ultrasonic cleaning is very effective for removing particulate as low as 1 to 5 micrometers in size. However, for particles below this range, the effectiveness of ultrasonics at 20 to 100 Kilohertz is poor and ultrasonic frequencies can be damaging to delicate substrates, such as silicon wafers. Further, in order to remove sub-micrometer particulates, scrubbing techniques are employed which are often harsh to the product and difficult to use consistently. Similarly, high pressure water jets can be harmful to the part being cleaned.

Current megasonic precision cleaning systems utilize aqueous based or organic solvent media, as described, for example, in U.S. Pat. No. 5,062,898, issued to McDermott et al. Aqueous methods typically use surfactants, hydrogen peroxide/ammonium hydroxide or hydrochloric acid. These methods are expensive, require laborious drying techniques, use toxic/hazardous chemicals, and are environmentally undesirable. Compressed gas ultrasonic and supercritical fluid cleaning methods are environmentally sound and low-cost, but are not very effective for sub-micrometer particles.

Thus, a process for removing sub-micrometer particles from substrates is needed. Such a cleaning process would be simple and employ inexpensive, nontoxic cleaning media.

SUMMARY OF THE INVENTION

In accordance with the invention, undesired sub-micrometer particulates are removed from a chosen substrate by a process comprising the steps of: (a) placing the substrate containing the undesired particulates in a cleaning chamber provided with (1) means for supporting the substrate in the cleaning chamber, (2) megasonic energy-producing transducer means attached to the means for supporting the substrate and oriented so as to emit megasonic energy parallel to the substrate surface to be cleaned, and (3) means for deflecting the energy so as to prevent the megasonic energy from destructively interfering with itself; (b) introducing into the cleaning chamber a fluid comprising (1) a liquefied gas, or (2) a mixture of liquefied gases, or (3) a liquefied gas containing a liquid modifier, the fluid formed by applying a pressure of about 600 to 3,000 pounds per square inch (42.2 to 210.9 $Kg/cm^2$) at a temperature of about 50° C. or less thereto, and contacting the substrate containing the undesired particulates with the fluid at a temperature below its critical temperature; and (c) exposing the fluid to the transducer means for a period of time sufficient to remove the undesired particulates from the substrate.

Liquid carbon dioxide ($CO_2$) is an inexpensive, nontoxic substance. The cleaning process utilizing liquid $CO_2$ is relatively simple, and contaminants taken up in liquid $CO_2$ are easily removed therefrom, such as by decompression of the liquid or by filtration or by a combination of the two. Other suitable liquefiable gases, gas mixtures, or gases modified with other liquids or gases may be employed in the practice of the invention.

The present invention employs ultra high frequency vibrations of greater than 110 to 2,000 Kilohertz to produce a megasonic cleaning system. Megasonic cleaning is typically performed in fluids which are normally liquids under ambient conditions. This invention allows megasonic cleaning to be performed in compressed condensed gases.

The invention permits the removal of sub-micrometer particles to be performed with high efficiency using compressed condensed fluids. Furthermore, this invention allows the use of environmentally safe cleaning systems as replacements for current precision cleaning practices. Also, this invention precludes a final drying step, which is very time and energy consuming, as is currently used in many methods which require the use of water. The present invention provides for a highly effective, inexpensive, and environmentally sound means of cleaning.

BRIEF DESCRIPTION OF THE DRAWINGS

The sole FIGURE is a schematic diagram of megasonic cleaning apparatus useful in the practice of the invention.

DESCRIPTION OF THE PREFERRED EMBODIMENTS

The present invention is applicable to many processes involving supercritical fluids such as carbon dioxide for precision cleaning, extractions, particulate removal, and degreasing. The present invention is applicable for general particulate removal processes, but is most useful when high-level precision cleaning is required. Exemplary applications include cleaning during manufacture of contact lenses, silicon wafers, magnetoresistive heads, and other solid state devices, precision mirrors and optical lenses, and optical parts for lasers.

The prior art ultrasonic cleaning process is a very effective technique for removing particulate from parts requiring precision cleaning and has been used in conjunction with many organic and aqueous solvents to remove organic contamination as well. Ultrasonic cavitation works by forming vacuum bubbles which, upon implosion, release high energies which dislodge and displace particulates in the vicinity of the collapsing bubble. However, surface energies are such that with most surface types, for particles below 1.0 micrometer, ultrasonic cavitation is not sufficient to remove this particulate with high efficiency.

Megasonic energy is more efficient than ultrasonic cleaning for sub-micrometer particulate removal because it functions via a different mechanism. Because megasonic energy occurs at higher frequencies than ultrasonic energy, the pressure wave that forms generates a pulse so rapidly that the vacuum bubbles do not have time to form. Consequently, megasonic energy consists of a series of pressure waves. When applied parallel to a surface, this wave dislodges particulates, usually by first allowing a thin film of the solvent medium to form between the particulate and the surface, thereby reducing the attraction between the surface and the particulate and facilitating removal of the particle.

Obviously, many different solvents may be used in this process. However, when compressed, condensed gases are used, several advantages are realized. First, no drying or separate solvent removal step is required. The process of removing the part from the vessel results in the complete elimination of the condensed gas "solvent". Also, because the solvent becomes a gas at ambient conditions, it is conveniently recycled and the need to dispose of waste solvent is eliminated. Finally, when using condensed gases such as $CO_2$, a very cost effective and environmentally sound method is provided. Furthermore, when combined with sequential supercritical phase cleaning, a convenient and complete cleaning process for particulate and organic contamination removal can be obtained.

Similarly, with a modified compressed gas, described in further detail below, both the compressed gas and the entrained liquid modifier are quickly removed from the part. This fluid is treated within the separator to isolate the modifier and contaminants and recycle the compressed gas. The separated modifier is then either recycled or disposed of as waste.

The fluid used in the practice of the present invention is chosen to be a gas, or mixture of gases, or other fluids, which can be liquefied under moderate conditions of pressure and temperature, typically, for practical purposes, a pressure of about 600 to 3,000 pounds per square inch (42.2 to 210.9 $Kg/cm^2$) and a temperature of about 50° C. or less. In addition, for practical purposes, it is desirable that the fluid is also non-toxic, non-flammable, and does not cause any damage to the environment.

Gases which are suitable for practicing the present invention include, but are not limited to, carbon dioxide, nitrogen, nitrous oxide ($N_2O$), sulfur hexafluoride ($SF_6$), and xenon, with carbon dioxide being most preferred. In the following discussions, carbon dioxide is used as an example of one gas which may be used in practicing the present invention, but it is to be understood that the invention is not so limited.

Carbon dioxide is an unlimited, inexpensive, nontoxic, and easily liquefiable natural resource. Once liquefied, it offers a good, low viscosity sonicating medium, at relatively low pressures (about 600 to 1,040 pounds per square inch, or about 42.2 to 73.1 $Kg/cm^2$) and mild temperatures (about 10° to 30° C.). These values are below the critical pressure of 75.3 $Kg/cm^2$ and the critical temperature of 32° C. for $CO_2$.

When a liquefiable gas is used with modifiers, typically a small percentage (less than about 50 vol/vol percent) of a condensed phase solvent, or modifier, is added to the bulk compressed gas. These modifiers are mixed with the compressed gas to form a non-flammable, non-toxic mixture. The modifiers change the critical point of the mixture so that higher pressures (up to about 3,000 pounds per square inch, or 210.9 $Kg/cm^2$) and temperatures (up to about 50° C.) can be used, which provides improved sonication. In addition, the modifiers change the chemical properties of the condensed gas to improve the solubility properties of the mixture. The modifier or modifiers used depend on the contaminant being removed. For removing polar organic contaminants, a solvent such as iso-propanol or acetone is employed. For removing polar inorganic contaminants, water is desirably employed. For removing low molecular weight non-polar organic ($C_6$ to $C_{18}$) contaminants, a solvent such as hexane may be used. For removing high molecular weight non-polar organic ($>C_{18}$) contaminants, a solvent such as kerosene may be used.

The megasonic energy required in the practice of the present invention may be produced by means such as a high frequency transducer that produces energy having a frequency of greater than 110 to 2,000 Kilohertz, and preferably about 800 to 1,000 Kilohertz. Such megasonic energy-producing transducers are commercially available.

A schematic of the apparatus used in practicing the present invention is shown in the sole FIGURE, which depicts an extractor/cleaning vessel 10. The cleaning vessel 10 comprises a walled cleaning chamber 12 formed of an appropriate material, such as stainless steel, and provided with walls of a sufficient thickness to withstand the pressures employed in the process. The cleaning chamber 12 is provided with a lid 14, also of such sufficient thickness.

Parts 16 to be cleaned are placed in the cleaning chamber 12. The parts 16 are supported on a fixture 18 that serves to support both the part and a high frequency transducer 20.

The transducer 20 and parts 16 are oriented so that the megasonic wave that is produced is parallel to the surface of the part being cleaned. The fixture 18 is further provided with deflector means 18a which prevent deflection of the megasonic energy back on itself, which would otherwise result in undesirable destructive interference, and thus reduced cleaning efficiency. The fixture 18 is also provided with openings 18' in the bottom thereof, to permit draining of cleaning fluid from the fixture.

Processing begins by flushing the parts 16 with a liquid or supercritical fluid; then the chamber 12 is filled with liquid 22 and the transducer 20 is energized. Megasonic energy is supplied, for example, at 800 to 1,000 Kilohertz through the transducer 20, such as a quartz transducer, which is controlled by a radio frequency (RF) generator 24 and power supply 26. The power supply 26 is controlled through a control box 28 by means of a control panel 30. The transducer 20, RF generator 24, power supply 26, control box 28, and control panel 30 are conventional items in megasonic energy-producing systems, and are commercially available.

Cleaning is typically performed for a few minutes without fluid circulation, and then clean fluid is quickly pumped through the chamber 12, as described below, to remove the liberated particles.

Liquid 22 is provided to the chamber 12 through inlet means 32 from a reservoir 34 by means of a compressor or high pressure pump 36. The liquid 22 is purified before use by filter 38 and separators 40, 42 to remove particulate and organic contamination. Cyclone separator 42 removes large particulates (i.e., >100 μm), separator 40 removes organics, and filter 38 removes small particulates (i.e., 0.1 to 100 μm).

After cleaning, the liquid 22 exits from the chamber 12 by outlet means 44 and may be vented (not shown) or recycled back to the liquid reservoir 34, as shown in the Figure.

Additionally, the cleaning chamber 12 may incorporate an internal heating/cooling coil 46 for controlling the temperature of the liquid 22. In addition, a thermocouple (not shown) and a pressure gauge (or pressure transducer) (not shown) may be used to determine and control the temperature and pressure, respectively, in the cleaning chamber 12. The cleaning chamber 12 may optionally have ports (not shown) to accommodate an external liquid level indicator (not shown) to indicate the level of the liquid 22 in the chamber 12.

The parameters of sonication include the temperature and pressure of the fluid, such as liquid $CO_2$, and the sonicating conditions (frequency, time of sonication, etc.). The carbon dioxide or other gas or gas mixture or modified gas mixture must be in the liquid state. Hence, the temperature and pressure must be above the triple point (e.g., −57° C. and 75 pounds per square inch, or 5.3 $Kg/cm^2$ for $CO_2$). Furthermore, the temperature must be below the critical temperature. The pressure may be either above or below the critical pressure.

For pure compressed gases, the critical pressure and temperature will be that of the gas used. For gas mixtures, the critical pressure and temperature will vary as a function of the mixture used (i.e., the specific nature and amount of the added gases or modifiers).

Preferably, the temperature ranges from about 18° C. to just below the critical value for carbon dioxide, since the cleaning performance decreases below 18° C. and above the critical value. Under equilibrium conditions, the pressure is fixed by the temperature, and thus preferably ranges from about 820 pounds per square inch (about 57.7 $Kg/cm^2$) to just below the critical value for carbon dioxide.

The present process does not appear to depend on the particular megasonic frequency, and any of the commercially available apparatus may be used. Commercial ultrasonic generators typically operate at a frequency of about 800 to 1,000 Kilohertz, and these generators are advantageously employed in the practice of the present invention.

In operation, the parts 16 to be cleaned are introduced into the cleaning chamber 12. Liquid $CO_2$ is then introduced into the cleaning chamber 12 through inlet 32, as described above, under controlled conditions of flow rate, temperature, and pressure, as are known in the art. The liquid $CO_2$ is introduced at a temperature below the critical value for $CO_2$, as indicated above. Temperature can be controlled either by filling the chamber with pre-heated or cooled liquid $CO_2$ or by heating or cooling the chamber. Normally, the pressure will be fixed by the vapor pressure of $CO_2$ at a given temperature. It may be desirable in some cases to provide increased pressure in order to produce more vigorous sonication. To provide this additional pressure, a non-condensible gas (i.e., a gas which is not liquefied at the temperature at which the process of the present invention is conducted), such as nitrogen, may be introduced to the chamber by means of a compressor or a high pressure gas cylinder. Additional pressure may also be provided by filling the chamber completely full of liquid $CO_2$ and controlling the pressure of the inlet or outlet stream.

Sonication is then applied at the above-indicated frequency. The time of sonication is dependent on the particular sample being cleaned and the nature of the undesired material, or contaminant, to be removed. Some samples cannot be exposed to sonication for prolonged periods of time. On the other hand, some undesired materials take longer to remove than others. Simple experimentation will determine optimum times for sonication to remove substantially all contaminants. In general, sonication for at least about 1 minute is expected to remove a substantial amount of the contaminants, with a maximum of about 1 hour possibly required in some cases. However, under certain circumstances, even further sonication may be required, for the reasons stated above.

At the completion of the sonication cycle, a liquid $CO_2$ purge is initiated. Following the purge step, the chamber can be decompressed for removal of the sample, or, the cleaning step can be repeated as required. To determine if the part is sufficiently clean, spot checking by surface analysis or by extraction analysis may be performed or measurements of particulate concentration may be made, as appropriate.

In a further embodiment of the invention, the parts 16 to be cleaned also have organic contaminants in addition to particulate contaminants. The parts 16 are loaded in the cleaning chamber 12, which is then closed and purged with $CO_2$ gas for a predetermined period of time. The chamber is pressurized and heated to a suitable supercritical level which is determined by the specific contaminants and substrates, to remove the bulk of the organic contamination. Specifically, both the pressure and temperature are adjusted to exceed the critical values for $CO_2$. The sample is exposed to $CO_2$ in the dense, or supercritical, phase for a period of time which is sufficient to dissolve the organic contaminants which are soluble in supercritical $CO_2$ (referred to herein as "soluble contaminants").

The temperature is then reduced below its critical value to liquefy the $CO_2$. Sonication of the liquid $CO_2$ is initiated to remove particulates, as described above. The steps of treatment by sonication and treatment with supercritical $CO_2$ may be repeated as many times as are required to clean the sample.

In another embodiment of the invention, the parts to be cleaned which have organic contaminants as well as particulate contaminants are treated in accordance with the process of the present invention and are subsequently subjected to dense phase gas cleaning by repressurizing and reheating the $CO_2$ to supercritical conditions. This two-step process is useful, for example, to remove compact mixtures of particulates and soluble contaminants. The steps of treatment with supercritical $CO_2$ and treatment by sonication may be repeated as many times as required to clean the sample.

In yet another embodiment of the present invention, a closed loop, recirculating liquid $CO_2$ regenerating system is employed, in which the removed contamination (be that organic or particulate) can be readily separated from the megasonic transmitting medium. This can be accomplished either by decompression, filtration, or a combination of both. By the decompression of the liquid $CO_2$, gaseous $CO_2$ is formed and the contaminants separate out in a concentrated form that allows for easy disposal. The clean gaseous $CO_2$ remaining is then recompressed to the liquid state and the clean liquid $CO_2$ is recirculated to the cleaning chamber 12. To accomplish this process, the liquefied gas containing the contaminants is transported out of the chamber 12 through outlet means 44 to a treatment unit (not shown). In the treatment unit, the contaminated liquefied gas is decompressed and/or filtered as indicated above. The clean liquid $CO_2$ is then transported by tubing (not shown) into chamber 12 through inlet means 32.

Thus, there has been disclosed a process for removing sub-micrometer particulates from substrates, using liquefied gas. It will be appreciated by those skilled in the art that various modifications and changes of an obvious nature may be made without departing from the scope of the invention, and all such modifications and changes are intended to fall within the scope of the invention, as defined by the appended claims.

What is claimed is:

1. A process for removing undesired sub-micrometer particulates from a surface of a substrate comprising the steps of:

(a) placing said substrate containing said undesired particulates having a size of 1.0 micrometer or less in a cleaning chamber provided with (1) means for supporting said substrate in said cleaning chamber, (2) megasonic energy-producing transducer means attached to said means for supporting said substrate and oriented so as to emit megasonic energy parallel to said surface of said substrate, and (3) means for deflecting said megasonic energy so as to prevent said megasonic energy from destructively interfering with itself;

(b) introducing into said cleaning chamber a fluid selected from the group consisting of (1) a liquefied gas, (2) a mixture of liquefied gases, and (3) a liquefied gas containing less than 50 vol/vol percent of a liquid modifier, said liquid modifier added to increase solubility properties of said gas, said fluid formed by applying a pressure of about 600 to 3,000 pounds per square inch (42.2 to 210.9 $Kg/cm^2$) at a temperature of up to about 50° C. thereto, and contacting said substrate containing said undesired particulates with said fluid at a temperature below the critical temperature of said gas, said gas selected from the group consisting of carbon dioxide, nitrogen, nitrous oxide, sulfur hexafluoride, and xenon and mixtures thereof; and (c) exposing said fluid in said cleaning chamber to said megasonic energy transducer means emitting a frequency ranging from about 110 to 2,000 Kilohertz to generate a series of pressure waves applied parallel to said surface for a period of time sufficient to thereby remove said undesired sub-micrometer particulates from said substrate.

2. The process of claim 1 wherein said substrate has at least one contaminant thereon selected from the group consisting of polar organic contaminants, polar inorganic contaminants, low molecular weight non-polar organic contaminants, and high molecular weight non-polar organic contaminants and said liquid modifier is selected from the group consisting of (a) iso-propanol and acetone for treating said polar organic contaminants, (b) water for treating said polar inorganic contaminants, (c) hexane for treating said low molecular weight non-polar organic contaminants, and (d) kerosene for treating said high molecular weight non-polar organic contaminants.

3. The process of claim 1 wherein said substrate has organic contaminants thereon and further comprising the step of, prior to contacting said substrate containing said undesired particulates with said fluid, contacting said substrate with said gas in the dense phase at a pressure above the critical pressure of said gas and at a temperature above the critical temperature of said gas for a period of time sufficient to remove said organic contaminants which are soluble in said gas in said dense phase.

4. The process of claim 1 wherein said substrate has organic contaminants thereon and further comprising the step of, after said exposing step, contacting said substrate with said gas in the dense phase at a pressure above the critical pressure of said gas and at a temperature above the critical temperature of said gas for a period of time sufficient to remove said organic contaminants which are soluble in said gas in said dense phase.

5. The process of claim 1 further comprising the step of, following said exposing step, treating said fluid containing said undesired particulates to remove said undesired particulates and returning said treated fluid to said cleaning vessel.

6. The process of claim 5 wherein said fluid is treated by at least one of decompression and filtration.

7. The process of claim 6 wherein said fluid is decompressed to form said gas and to allow said undesired particulates to separate from said gas, and said gas is then recompressed to generate said fluid.

8. The process of claim 1 wherein said gas is carbon dioxide and said temperature ranges from about 10° to 30° C.

9. The process of claim 8 wherein said pressure ranges from about 600 to 1,040 pounds per square inch (about 42.2 to 73.1 $Kg/cm^2$).

10. The process of claim 9 wherein said pressure is at least about 820 pounds per square inch (about 57.7 $Kg/cm^2$).

11. The process of claim 8 wherein said temperature is at least about 18° C.

12. The process of claim 1 wherein said exposing is carried out for a period of time of at least about 1 minute.

13. The process of claim 1 wherein said frequency ranges from about 800 to 1,000 Kilohertz.

14. The process of claim 1 wherein at least step (c) is repeated at least once.

* * * * *